US009005413B2

(12) United States Patent
Kodaira et al.

(10) Patent No.: US 9,005,413 B2
(45) Date of Patent: Apr. 14, 2015

(54) FILM FORMATION APPARATUS

(75) Inventors: Shuji Kodaira, Susono (JP); Tomoyuki Yoshihama, Susono (JP); Koukichi Kamada, Susono (JP); Kazumasa Horita, Susono (JP); Junichi Hamaguchi, Susono (JP); Shigeo Nakanishi, Susono (JP); Satoru Toyoda, Susono (JP)

(73) Assignee: ULVAC, Inc., Chigasaki-Shi (JP)

( * ) Notice: Subject to any disclaimer, the term of this patent is extended or adjusted under 35 U.S.C. 154(b) by 0 days.

(21) Appl. No.: 13/382,543

(22) PCT Filed: Jul. 15, 2010

(86) PCT No.: PCT/JP2010/061975
§ 371 (c)(1),
(2), (4) Date: Jan. 6, 2012

(87) PCT Pub. No.: WO2011/007831
PCT Pub. Date: Jan. 20, 2011

(65) Prior Publication Data
US 2012/0103801 A1 May 3, 2012

(30) Foreign Application Priority Data
Jul. 17, 2009 (JP) .................... 2009-169448

(51) Int. Cl.
C23C 14/34 (2006.01)
C23C 14/35 (2006.01)
H01L 21/285 (2006.01)

(52) U.S. Cl.
CPC ............... C23C 14/35 (2013.01); C23C 14/351 (2013.01); H01L 21/2855 (2013.01)

(58) Field of Classification Search
USPC ............... 204/298.16, 298.17, 298.19
See application file for complete search history.

(56) References Cited

U.S. PATENT DOCUMENTS 5,907,220 A    5/1999   Tepman et al.
7,527,713 B2 *  5/2009   Gung et al. .............. 204/192.12
(Continued)

FOREIGN PATENT DOCUMENTS

JP    60-136230           7/1985
JP    61158032 A  *      7/1986
(Continued)

OTHER PUBLICATIONS

Translation to Kurokome (JP 02-156536 as cited on IDS dated Dec. 4, 2012) published Jun. 1990.*
(Continued)

Primary Examiner — John Brayton
(74) Attorney, Agent, or Firm — Grossman, Tucker, Perreault & Pfleger, PLLC

(57) ABSTRACT

A film formation apparatus includes: a chamber having an inner space in which both a body to be processed and a target are disposed so that the body to be processed and the target are opposed to each other, a first magnetic field generation section generating a magnetic field in the inner space to which the target is exposed; a second magnetic field generation section generating a perpendicular magnetic field so as to allow perpendicular magnetic lines of force thereof to pass between the target the body to be processed; and a third magnetic field generation section disposed at upstream side of the target as seen from the second magnetic field generation section.

2 Claims, 3 Drawing Sheets

(56) References Cited

U.S. PATENT DOCUMENTS

| | | | | |
|---|---|---|---|---|
| 7,922,880 B1* | 4/2011 | Pradhan et al. | .......... | 204/298.06 |
| 2005/0199485 A1* | 9/2005 | Kadlec et al. | ............ | 204/192.12 |

FOREIGN PATENT DOCUMENTS

| | | |
|---|---|---|
| JP | 63-223173 | 9/1988 |
| JP | 1-132765 | 5/1989 |
| JP | 2-156536 | 6/1990 |
| JP | 3-111563 | 5/1991 |
| JP | 2008-047661 | 2/2008 |
| TW | 200926906 | 6/2009 |
| WO | 2009/038091 | 3/2009 |
| WO | 2009/053479 | 4/2009 |
| WO | 2009/069672 | 6/2009 |

OTHER PUBLICATIONS

International Search Report from corresponding PCT Application No. PCT/JP2010/061975 dated Aug. 10, 2010.

Notice of Allowance from corresponding Taiwanese Appln. No. 099123542 dated Jun. 6, 2013. English translation of the Search Report attached.

Office Action from corresponding Chinese Appln. No. 201080026236.2 dated Feb. 4, 2013. English translation of search report attached.

Office Action from corresponding Taiwanese Appln. No. 099123542 dated Feb. 4, 2013. English translation attached.

* cited by examiner

FILM FORMATION APPARATUS

CROSS-REFERENCE TO RELATED APPLICATION

This is the U.S. National Phase Application under 35 U.S.C. §371 of International Patent Application No. PCT/JP2010/061975 filed Jul. 15, 2010, which designated the United States and was published in a language other than English, which claims the benefit of Japanese Patent Application No. 2009-169448 filed on Jul. 17, 2009, both of them are incorporated by reference herein. The International Application was published in Japanese on Jan. 20, 2011 as WO2011/007831 A1 under PCT Article 21(2).

BACKGROUND OF THE INVENTION

1. Field of the Invention

The present invention relates to a film formation apparatus used for forming a film on a surface of a body to be processed, and particularly, relates to a film formation apparatus by use of a DC magnetron method using a sputtering method which is one of several thin film forming methods.

2. Background Art

Conventionally, a film formation apparatus using a sputtering method (hereinafter, refer to "sputtering apparatus") is used in a film formation step in which, for example, a semiconductor device is manufactured.

As a sputtering apparatus of such intended use, with miniaturizing of wiring pattern in recent years, an apparatus is increasingly and strongly required in a film can be formed over an entire substrate W to be processed with excellent coatability in microscopic holes having a high-aspect ratio such as the ratio of the depth divided by the width exceeding three, that is, improvement of coverage is strongly required.

Generally, in the aforementioned sputtering apparatus, a magnet assembly which is constituted of a plurality of magnets having alternately different polarities is disposed behind, for example, a target (opposite side of a sputtering face of a target).

This magnet assembly generates a tunnel-shaped magnetic field at the anterior target (space to which a sputtering face is exposed), the electron density is improved at the anterior target and the plasma density becomes high as a result of capturing electrons which are ionized at the anterior target and secondary electrons generated by sputtering.

In such sputtering apparatus, the region of the target which is affected according to the above-described magnetic field is preferentially sputtered.

Consequently, in terms of improvement of stability of the electric discharge, efficiency in the use of target, or the like, if the above-described region located near, for example, the center of the target, the amount of erosion in the target increases near the center thereof when sputtering is carried out.

In such case, the target material particles sputtered from the target (e.g., metal particles, hereinafter referred to as "sputtered particles") are adhered to a peripheral portion of the substrate at an angle which is inclined with respect to a vertical direction of the substrate.

As a result, in the case where the sputtering apparatus is used for the aforementioned film formation step, particularly, it is conventionally known that a problem of asymmetric coverage being formed at the peripheral portion of the substrate.

Particularly, in the cross-sectional face of the microscopic holes formed at the peripheral portion of the substrate, there is a problem in that the shape of a coat formed between the bottom of the microscopic holes and one of the side walls thereof is different from the shape of a coat formed between the bottom of the microscopic holes and the other of the side walls thereof.

In order to solve the foregoing problem, a sputtering apparatus is known in, for example, Japanese Unexamined Patent Application, First Publication No. 2008-47661, the apparatus includes a first sputtering target and a second sputtering target, the first sputtering target is disposed above a stage on which a substrate is mounted in a vacuum chamber and is substantially parallel to the top face of the stage, and the second sputtering target is disposed at obliquely upside of the stage so as to face in a diagonal direction with respect to the top face of the stage, that is, the apparatus provided with a plurality of cathode units.

However, as in disclosure of Japanese Unexamined Patent Application, First Publication No. 2008-47661, when cathode units are disposed inside the vacuum chamber, the constitution of the apparatus becomes complicated, sputtering power sources or magnet assemblies are also necessary in accordance with the number of targets, the number of components increases, there is a problem in that the cost thereof increases.

Furthermore, the efficiency in the use of the target deteriorates, and there is a problem in that the cost of manufacturing increases.

SUMMARY OF THE INVENTION

The invention was made in order to solve the above problems, and has an object to provide a film formation apparatus forming a coat with a high level of coatability in holes, trenches, or microscopic patterns, which have a high-aspect ratio and are formed on the substrate, and it is possible to ensure the same coatability of a peripheral portion of the substrate as that of a center portion of the substrate.

A film formation apparatus of a first aspect of the invention includes: a chamber having an inner space in which both a body to be processed and a target (base material of a coat) are disposed (stored) so that the body to be processed and the target are opposed to each other, the body to be processed having a film formation face, the target having a sputtering face; a pumping section reducing a pressure inside the chamber; a first magnetic field generation section generating a magnetic field in the inner space to which the sputtering face is exposed (anterior to the sputtering face); a direct-current power source applying a negative direct electric current voltage to the target; a gas introduction section introducing a sputter gas into the chamber; a second magnetic field generation section generating a perpendicular magnetic field so as to allow perpendicular magnetic lines of force thereof to pass between an entire surface of the sputtering face and an entire surface of the film formation face of the body to be processed; and a third magnetic field generation section disposed at upstream side of the target as seen from the second magnetic field generation section.

In the film formation apparatus of the first aspect of the invention, it is preferable that the second magnetic field generation section include: a first generation portion to which a current defined as "I(2u)" is applied, the first generation portion being disposed at a position close to the target (near the target); and a second generation portion to which a current defined as "I(2u)" is applied, the second generation portion being disposed at a position close to the body to be processed (near the body to be processed), and a current defined as "I(3)" is applied to the third magnetic field generation section.

Relational expression I(2u)=I(2d) . . . (A1) is satisfied and relational expression I(2u)<I(3) or relational expression I(2d)<I(3) . . . (A2) is satisfied.

In the film formation apparatus of the first aspect of the invention, it is preferable that the second magnetic field generation section include: a first generation portion to which a current defined as "I(2u)" is applied, the first generation portion being disposed at a position close to the target (near the target); and a second generation portion to which a current defined as "I(2u)" is applied, the second generation portion being disposed at a position close to the body to be processed (near the body to be processed), and a current defined as "I(3)" is applied to the third magnetic field generation section. Relational expression I(2d)=I(3) . . . (B1) is satisfied and relational expression I(2u)=0 . . . (B2) is satisfied.

A second aspect of a film formation apparatus of the invention includes: a chamber having an inner space in which both a body to be processed and a target (base material of a coat) are disposed (stored) so that the body to be processed and the target are opposed to each other, the body to be processed having a film formation face, the target having a sputtering face; a pumping section reducing a pressure inside the chamber; a first magnetic field generation section generating a magnetic field in the inner space to which the sputtering face is exposed (anterior to the sputtering face); a direct-current power source applying a negative direct electric current voltage to the target; a gas introduction section introducing a sputter gas into the chamber; a second magnetic field generation section generating a perpendicular magnetic field so as to allow perpendicular magnetic lines of force thereof to pass between an entire surface of the sputtering face and an entire surface of the film formation face of the body to be processed; and a forth magnetic field generation section disposed at downstream side of the body to be processed as seen from the second magnetic field generation section.

EFFECTS OF THE INVENTION

The film formation apparatus of the invention includes: the first magnetic field generation section generating the magnetic field in the inner space which is exposed the sputtering face of the target; and the second magnetic field generation section generating a perpendicular magnetic field so as to allow the perpendicular magnetic lines of force thereof to pass between the entire surface of the sputtering face of the target and the entire surface of the film formation face to be film-formed of the body to be processed. Furthermore, the film formation apparatus includes the third magnetic field generation section provided at the upstream side of the target as seen from the second magnetic field generation section.

Because of this, the perpendicular magnetic field lines pass (through) target, and the sputtered particles which are scattered in the position close to the target (near the target) are effectively induced toward the body to be processed.

For this reason, it is possible to form a coat with a high level of coatability in the holes, the trenches, or the microscopic patterns, which have a high-aspect ratio and are formed on the body to be processed.

Furthermore, it is possible to form a coat on a peripheral portion of the body to be processed with the same coatability as the coatability of a center portion of the body to be processed.

Additionally, the problem in that asymmetric coverage is formed on the peripheral portion of the processed body is solved.

Particularly, the problem is solved in that the shape of the coat formed between the bottom of the microscopic holes and one of the side walls thereof is different from the shape of the coat formed between the bottom of the microscopic holes and the other of the side walls thereof in the cross-sectional face of the microscopic holes formed at the peripheral portion of the substrate.

DESCRIPTION OF THE PREFERRED EMBODIMENTS

Figure 1:
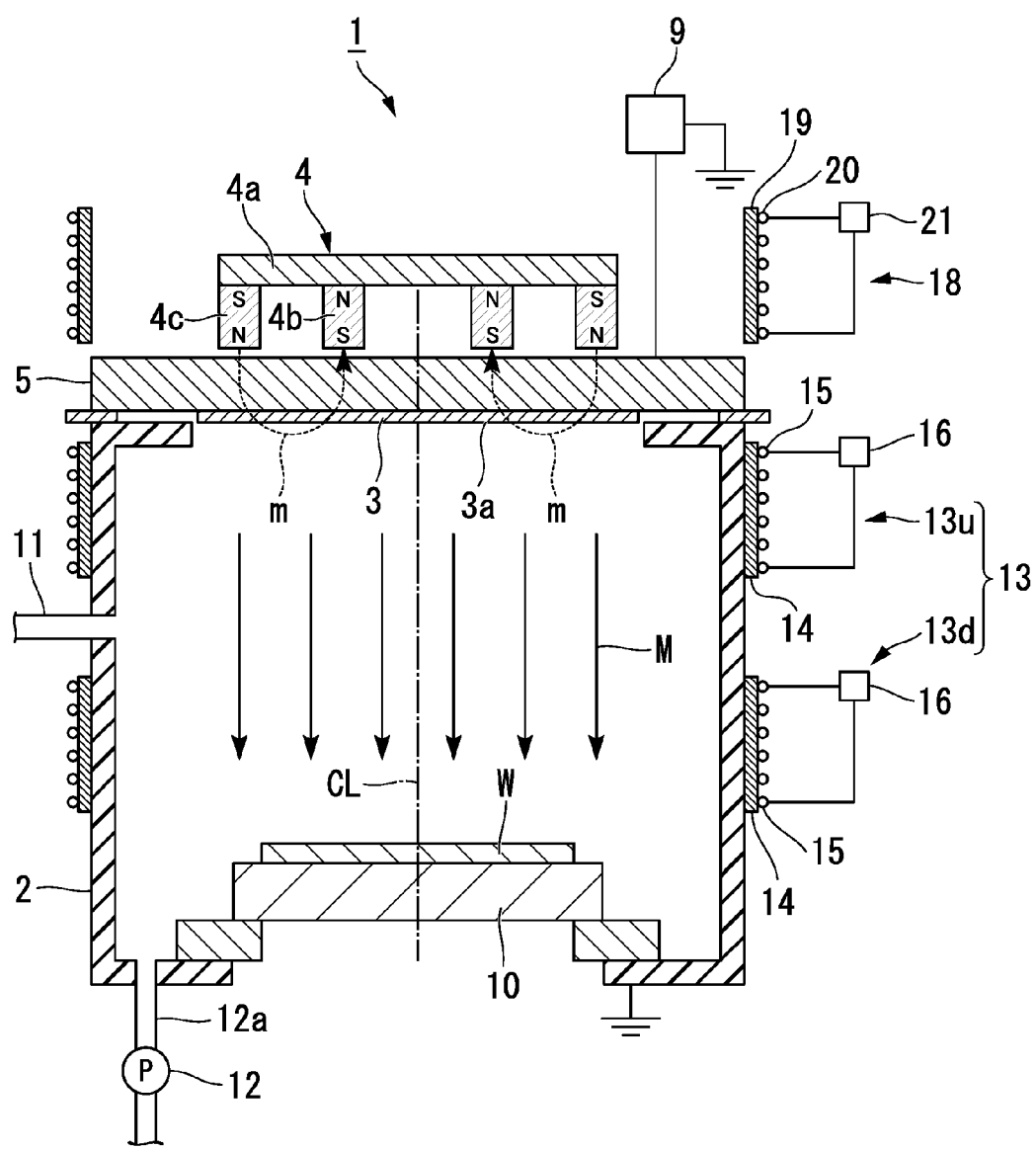
FIG. 1 is a cross-sectional view schematically showing the structure of a film formation apparatus related to the invention.

Hereinafter, an embodiment of a film formation apparatus related to the invention will be described with reference to drawings.

Additionally, in order to make the respective components be of understandable size in the drawing, the dimensions and the proportions of the respective components are modified as needed compared with the real components in the respective drawings used in explanation described below.

As shown in FIG. 1, a film formation apparatus 1 is a film formation apparatus using a DC magnetron sputtering method and is provided with a vacuum chamber 2 (chamber) capable of generating a vacuum atmosphere.

A cathode unit C is attached to a ceiling portion of the vacuum chamber 2.

Moreover, in the explanation described below, the position close to the ceiling portion of the vacuum chamber 2 is referred to as "upper" and the position close to the bottom portion of the vacuum chamber 2 is referred to as "lower".

The cathode unit C is provided with a target 3, and the target 3 is attached to a holder 5.

Furthermore, the cathode unit C provided with a first magnetic field generation section 4 generating a tunnel-shaped magnetic field in a space (anterior to sputtering face 3a) to which a sputtering face (lower face) 3a of the target 3 is exposed.

The target 3 is made of a material, for example, Cu, Ti, Al, or Ta, which is appropriately selected in accordance with the composition of the thin film which is to be formed on a substrate W to be processed (body to be processed).

The target 3 is formed in a predetermined shape (e.g., a circular form in a plan view) using a known method so that the shape thereof corresponds to the shape of the substrate W to be processed and so that the surface area of the sputtering face 3a is greater than the surface area of the substrate W.

Additionally, the target 3 is electrically connected to a DC power source 9 (sputtering power source, direct-current power source) having a known structure, and a predetermined negative electrical potential is applied to the target 3.

The first magnetic field generation section 4 is disposed at the position of the holder 5 (upper side, back side of the target 3 or holder 5) opposite to the position at which the target 3 (sputtering face 3a) is disposed.

The first magnetic field generation section 4 is constituted of a yoke 4a disposed in parallel with the target 3 and magnets 4b and 4c provided at a lower face of the yoke 4a.

The magnets 4b and 4c are arranged so that polarities of leading ends of magnets 4b and 4c arranged at the position close to the target 3 are alternately different from each other.

The shape or the number of the magnets 4b and 4c is appropriately determined in accordance with the magnetic field (shape or profile of magnetic field) formed in the space (anterior to the target 3) to which the sputtering face 3a is exposed in terms of improvement of stability of the electric discharge, efficiency in the use of target, or the like.

As a shape of the magnets 4b and 4c, for example, a lamellate shape, a rod shape, or a shape to which such shapes are appropriately combined may be employed.

Moreover, a transfer mechanism may be provided at the first magnetic field generation section 4, the first magnetic field generation section 4 may be reciprocally moved or rotated at the back face side of the target 3 by the transfer mechanism.

A stage 10 is disposed at the bottom of the vacuum chamber 2 so as to face the target 3.

The substrate W is mounted on the stage 10, the position of the substrate W is determined by the stage 10, and the substrate W is maintained.

Furthermore, one end of a gas pipe 11 (gas introduction section) introducing a sputter gas such as argon gas or the like thereinto is connected to a side wall of the vacuum chamber 2, and the other end of the gas pipe 11 is communicated with a gas source with a mass-flow controller (not shown in the figure) interposed therebetween.

Additionally, an exhaust pipe 12a which is communicated with a vacuum pumping section 12 (pumping section) is connected to the vacuum chamber 2, and the vacuum pumping section 12 is constituted of a turbo-molecular pump, a rotary pump, or the like.

Figure 3:
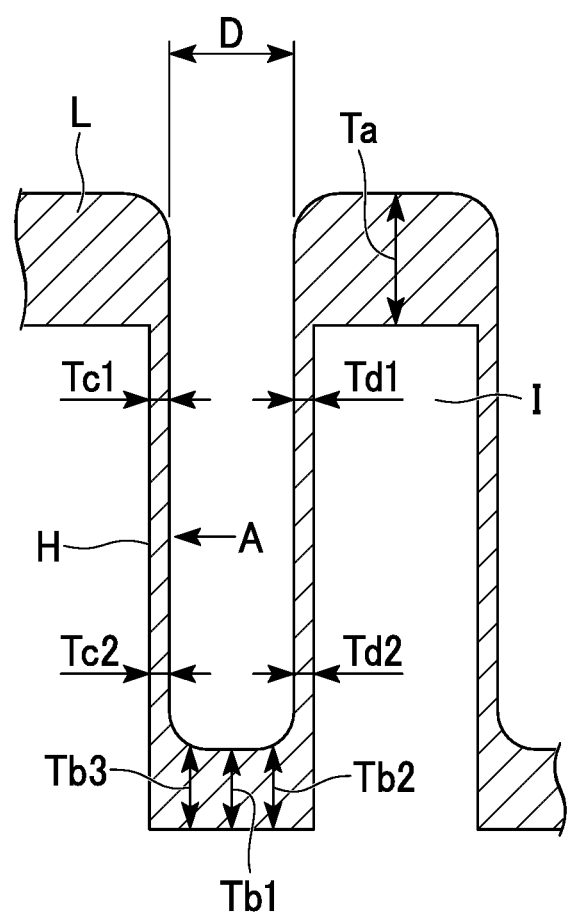
FIG. 3 is a cross-sectional view schematically showing the structure of a microscopic hole and a trench having a high-aspect ratio, which are formed on a substrate.

FIG. 3 partially shows a substrate on which a coat is formed by use of the film formation apparatus 1 and is a cross-sectional view schematically showing the structure of a microscopic hole and a trench having a high-aspect ratio, which are formed on a substrate.

In FIG. 3, reference numeral H indicates a microscopic hole having a high-aspect ratio, and reference numeral L indicates a thin film formed on the substrate.

In the substrate W to be subjected to a film formation processing, a microscopic hole H having a high-aspect ratio is formed in this silicon oxide film by patterning after a silicon oxide film (insulating film) I is formed on the top face of a Si wafer.

However, in a conventional film forming method, when the target 3 is sputtered, the region of the target 3 which is affected according to the magnetic field generated by the first magnetic field generation section 4 is preferentially sputtered, and target material particles that are target material particles are scattered due to this sputtering.

In this case, erosion is generated at the region in the target which is affected according to the magnetic field as described above.

Additionally, the sputtered particles which are flied from the target are incident to a peripheral portion of the substrate W at an angle which is inclined with respect to the direction vertical to the substrate W, and are adhered to the substrate W.

When a thin film L such as a barrier layer made of Ti or Ta, a seed layer made of Al or Cu, or the like is formed on the substrate W by sputtering target 3 using such conventional film forming method, there is a problem in that asymmetric coverage is formed in the microscopic holes which are located at the peripheral portion of the substrate W.

Particularly, due to the sputtered particles being adhered to the peripheral portion of the substrate W at the angle which is inclined with respect to the direction vertical to the substrate W, the shape of the coat formed between the bottom of the microscopic holes and one of the side walls thereof is different from the shape of the coat formed between the bottom of the microscopic holes and the other of the side walls thereof in the cross-sectional face of the microscopic holes formed at the peripheral portion of the substrate.

Figure 2A:
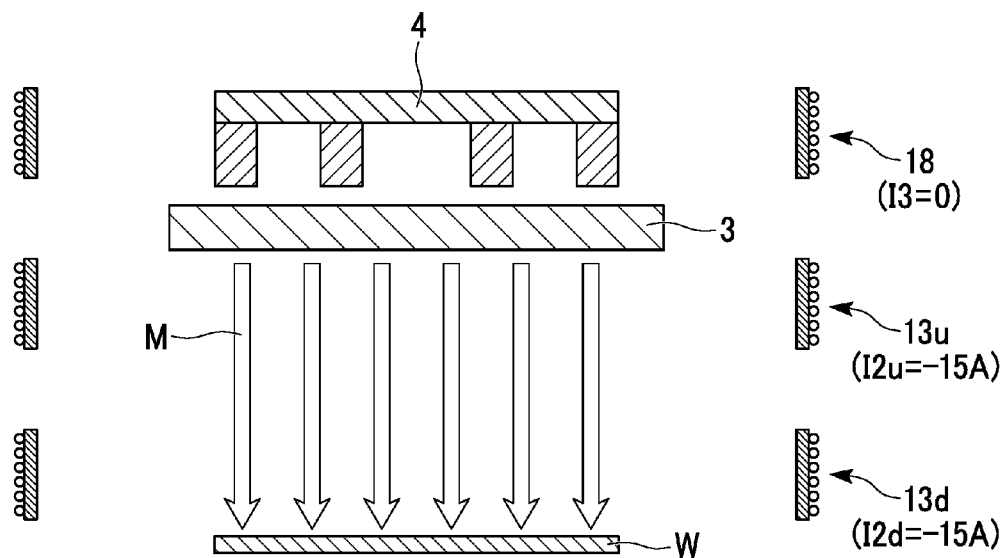
FIG. 2A is a diagram showing a state where a perpendicular magnetic field is generated in the film formation apparatus related to the invention.

In contrast, a second magnetic field generation section 13 and a cathode coil 18 (third magnetic field generation section) are provided in the film formation apparatus 1 of the embodiment, and the second magnetic field generation section 13 and the cathode coil 18 generate perpendicular magnetic field lines M between the entire surface of the sputtering face 3a of the target 3 and the entire surface of the substrate W as shown in FIG. 2A.

The second magnetic field generation section 13 includes an upper coil 13u (first generation portion) disposed at the position close to the target 3 and a lower coil 13d (second generation portion) disposed at the position close to the substrate W.

The upper coil 13u and the lower coil 13d are provided at external walls of the vacuum chamber 2 and around the reference axis CL connecting between the centers of the target 3 and the substrate W.

The upper coil 13u and the lower coil 13d are arranged separately from each other at a predetermined distance in the vertical direction of the vacuum chamber 2.

The upper coil 13u includes a ring-shaped coil support member 14 which is provided at the external walls of the vacuum chamber 2, and the upper coil 13u is configured by winding a conductive wire 15 on the coil support member 14.

Furthermore, a power supply device 16 supplying electrical power to the upper coil 13u (energization) is connected to the upper coil 13u.

The lower coil 13d includes a ring-shaped coil support member 14 which is provided at the external walls of the vacuum chamber 2, and the lower coil 13d is configured by winding a conductive wire 15 on the coil support member 14.

Furthermore, a power supply device 16 supplying electrical power to the lower coil 13d (energization) is connected to the lower coil 13d.

The third magnetic field generation section is disposed around the reference axis CL connecting between the centers of the target 3 and the substrate W, and the third magnetic field generation section is installed above two coil support members 14 by use of a predetermined installation method.

That is, the third magnetic field generation section is provided at the upstream side of the target 3 as seen from the second magnetic field generation section 13 in the perpendicular magnetic field.

Figure 2B:
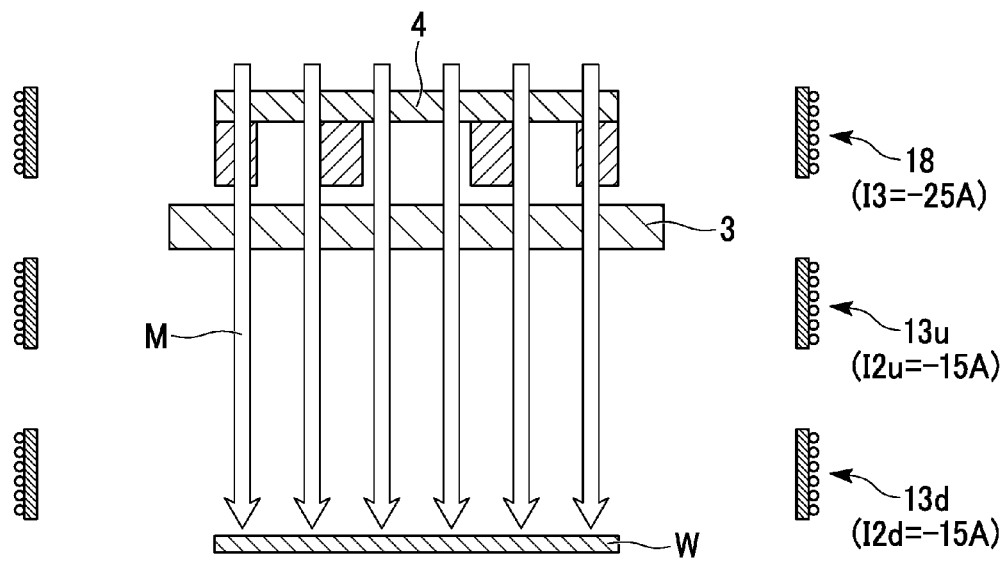
FIG. 2B is a diagram showing a state where a perpendicular magnetic field is generated in the film formation apparatus related to the invention.

Moreover, the third magnetic field generation section is provided with the cathode coil 18 that is configured by winding a conductive wire 20 on the coil support member 19 and a power supply device 21 that supplies electrical power to the cathode coil 18 (energization) (refer to FIGS. 1, 2A, and 2B).

In addition, as shown in FIG. 1, the third magnetic field generation section is disposed above the target so as to surround the first magnetic field generation section 4.

The number of the coils, the diameters of the conductive wires 15 and 20, or the number of windings of the conductive wires 15 and 20 are appropriately determined in accordance with, for example, the lengths of the target 3, the distance between the target 3 and the substrate W, the rated current of the power supply devices 16 and 21, or the intensity (gauss) of the magnetic field to be generated.

The power supply devices 16 and 21 have a known structure including a control circuit (not shown in the figure) that can optionally modulate the current value and the direction of the current to be supplied to each of the upper coil 13$u$, the lower coil 13$d$, and the cathode coil 18.

In the embodiment, the current value and the direction of the current to be supplied to each of the upper coil 13$u$ and the lower coil 13$d$ are selected so that a perpendicular magnetic field is generated in each of the upper coil 13$u$, the lower coil 13$d$, and the cathode coil 18 due to energization and so that the synthetic magnetic field in which the magnetic fields are combined forms a perpendicular magnetic field in the inner space of the vacuum chamber 2 (for example, the coil current is 15 A, the perpendicular magnetic field in the inner space is 100 gauss).

Particularly, in the embodiment, the constitution is described in which separate power supply devices 16 and 21 are provided at the upper coil 13$u$, the lower coil 13$d$, and the cathode coil 18 in order to optionally change the current value and the direction of the current to be supplied to each of the upper coil 13$u$, the lower coil 13$d$, and the cathode coil 18.

The invention is not limited to this configuration.

In the case of supplying electrical power to each of the coils 13$u$, 13$d$, and 18 by the same current values in the same directions of the currents, a constitution in which the electrical power is supplied to each of the coils 13$u$, 13$d$, and 18 by use of one power supply device may be adopted.

Additionally, the film formation apparatus 1 of the embodiment can control the electrical currents which are to be applied to the coils 13$u$, 13$d$, and 18 such that the values of the currents which are to be applied to the upper coil 13$u$, the lower coil 13$d$, and the cathode coil 18 are different from each other.

Furthermore, the film formation apparatus 1 can allow not to supply the electrical current to one of the coils 13$u$, 13$d$, and 18.

FIGS. 2A and 2B show perpendicular magnetic field lines M (M1, M2) passing (through) between the entire surface of the target 3 and the entire surface of the substrate W.

In FIGS. 2A and 2B, the magnetic field lines M and M2 is indicated by arrows, the arrows are illustrated for convenience and explanation, and the arrows do not limit the directions of magnetic fields.

That is, the magnetic field lines M and M2 include both a direction from North polarity toward South polarity in the magnet and a direction from South polarity toward North polarity in the magnet.

FIG. 2A shows the magnetic field lines M when the currents are applied to only the upper coil 13$u$ and the lower coil 13$d$.

Due to applying the currents to only the upper coil 13$u$ and the lower coil 13$d$, the magnetic field lines M are generated so as to pass between the target 3 and the substrate W.

On the other hand, FIG. 2B shows the magnetic field lines M when the current is applied to the cathode coil 18 in addition to the upper coil 13$u$ and the lower coil 13$d$.

Due to applying the current to the cathode coil 18, the magnetic field lines M pass through the inside of the target 3.

Additionally, in order to generate such magnetic field lines M, the values of the currents which are to be supplied to the upper coil 13$u$, the lower coil 13$d$, and the cathode coil 18 are determined as mentioned below in the embodiment.

That is, where the value of the current supplied to the upper coil 13$u$ is defined as I(2u), the value of the current supplied to the lower coil 13$d$ is defined as I(2d), and the value of the current supplied to the cathode coil 18 is defined as I(3), the relational expression I(2u)=I(2d) is satisfied.

Furthermore, the relational expression I(2u)<I(3) or relational expression I(2d)<I(3) is satisfied.

Additionally, the values of the currents supplied to the upper coil 13$u$, the lower coil 13$d$, and the cathode coil 18 may be determined so as to satisfy the following condition.

That is, relational expression I(2d)=I(3) is satisfied, and relational expression I(2u)=0 is satisfied.

In the film formation apparatus 1 including the above-described constitution, in the case where the sputtered particles scattered from the target 3 when the target 3 is sputtered have positive electrical charge, the scattering directions of the sputtered particles are changed according to the perpendicular magnetic field that is directed from the target 3 toward the substrate W.

For this reason, the sputtered particles are substantially perpendicularly directed to the substrate W and adhered to the entire surface of the substrate W.

Consequently, in a film formation step in which a semiconductor device is manufactured, it is possible to form a predetermined thin film L with excellent coatability in the microscopic holes and trenches H having a high-aspect ratio on the entire surface of the substrate W by use of the film formation apparatus 1 of the embodiment.

Furthermore, the problem in that asymmetric coverage is formed on the peripheral portion of the substrate W is solved.

Particularly, the problem is solved in that the shape of the coat formed between the bottom of the microscopic holes and one of the side walls thereof is different from the shape of the coat formed between the bottom of the microscopic holes and the other of the side walls thereof in the cross-sectional face of the microscopic holes formed at the peripheral portion of the substrate W.

Therefore, a uniformity in the thickness of a film which is formed on the inside surface (exposed surface) of the microscopic holes is improved.

In the foregoing film formation apparatus 1 of the embodiment, the first magnetic field generation section 4 which determines the region of the target 3 to be preferentially sputtered is not changed, the scattering directions in which of the sputtered particles are scattered are changed according to the magnetic fields that are generated by each of the coils 13$u$ and 13$d$ of the second magnetic field generation section 13 and the cathode coil 18 of the third magnetic field generation section.

Because of this, it is possible to decrease the cost of manufacturing the film formation apparatus or the running cost of the film formation apparatus while the utilization efficiency of the target 3 is not degraded and a plurality of cathode units such as the above-described conventional technique are not used.

Additionally, in the film formation apparatus 1, since the upper coil 13$u$, the lower coil 13$d$, and the cathode coil 18 are only provided outside the vacuum chamber 2, the constitution of the apparatus of the embodiment is extremely simple compared with the case such that the constitution of the apparatus is modified to use a plurality of cathode units, and the apparatus of the embodiment can be realized by modifying an existing apparatus.

Next, a film forming method using the above-described film formation apparatus 1 and a coat formed by this method will be described.

Firstly, a Si wafer is prepared as a substrate W on which a coat is to be formed.

A silicon oxide film I is formed on the top face of this Si wafer, and microscopic holes and trenches H used for wiring are formed in this silicon oxide film I by patterning in advance using a known method.

Subsequently, the case of forming a Cu film L serving as a seed layer on the Si wafer by sputtering using the film formation apparatus 1 will be described.

At first, the pressure inside the vacuum chamber 2 is reduced by activating the vacuum pumping section 12 so as to reach a predetermined vacuum degree (for example, $10^{-5}$ Pa order).

Next, a substrate W (Si wafer) is mounted on the stage 10, simultaneously, electrical power is provided to the upper coil 13$u$, the lower coil 13$d$, and the cathode coil 18 by activating the power supply devices 16 and 21, and the perpendicular magnetic field lines M are thereby generated between the entire surface of the target 3 and the entire surface of the substrate W.

Consequently, after the pressure inside the vacuum chamber 2 reaches a predetermined value, a predetermined negative electrical potential is applied (supplying electrical power) from the DC power source 9 to the target 3 while introducing argon gas or the like (sputter gas) into the inside of the vacuum chamber 2 at a predetermined flow rate.

For this reason, plasma atmosphere is generated in the vacuum chamber 2.

In this case, due to the magnetic field which is generated by the first magnetic field generation section 4, ionized electrons and secondary electrons generated by sputtering are captured in the space (anterior space) to which the sputtering face 3$a$ is exposed, and plasma is generated in the space to which the sputtering face 3$a$ is exposed.

Noble gas ions such as argon ions or the like in plasma collide with sputtering face 3$a$, the sputtering face 3$a$ is thereby sputtered, and Cu atoms or Cu ions scatter from the sputtering face 3$a$ toward the substrate W.

At this time, particularly, the directions in which Cu having positive electrical charge are scattered are converted into the direction vertical to the substrate W by the perpendicular magnetic field, and the sputtered particles are thereby substantially perpendicularly directed to the substrate W and adhered to the entire surface of the substrate W.

Because of this, the film is formed in the microscopic holes and trenches H on the entire surface of the substrate W with excellent coatability.

Additionally, the apparatus is described in the embodiment which allows the perpendicular magnetic field to be generated by providing electrical power to the upper coil 13$u$, the lower coil 13$d$, and the cathode coil 18, however, the invention is not limited to the apparatus constitution as long as the apparatus is capable of allowing the perpendicular magnetic field lines M to be generated between the entire surface of the target 3 and the entire surface of the substrate W.

The perpendicular magnetic field may be generated inside vacuum chamber by appropriately arranging, for example, a known sintered magnet at the internal side or the outer side of the vacuum chamber.

Moreover, the apparatus 1 is described in the embodiment which is provided with the third magnetic field generation section disposed at the upstream side of the target 3 in the perpendicular magnetic field, however, a forth magnetic field generation section may be disposed at the downstream side of the substrate W as seen from the second magnetic field generation section 13 in the invention.

EXAMPLES

Next, Examples of a film formation apparatus of the invention will be described.

In this Example, a Cu coat was formed on the substrate W by use of the film formation apparatus 1 shown in FIG. 1.

Specifically, the substrate W was prepared such that a silicon oxide film was formed over the entirety of the top face of a Si wafer of φ300 mm and microscopic trenches (the width thereof is 40 nm and the depth thereof is 140 nm) was formed on this silicon oxide film by patterning using a known method.

In addition, as a target, the target was used which is manufactured so that the compositional ratio of Cu is 99% and the diameter of the sputtering face is φ400 mm.

The distance between the target and the substrate was determined to be 400 mm, and the distance between the lower edge of the upper coil 13$u$ and the target 3 and the distance between the upper edge of the lower coil 13$d$ and the substrate W were determined to be 50 mm, respectively.

Additionally, the distance between the upper edge of the upper coil 13$u$ and the lower edge of the cathode coil 18 was determined to be 200 mm.

Furthermore, regarding a film formation condition, Ar was used as a sputter gas and the gas was introduced into the vacuum chamber at the flow rate of 15 sccm.

Moreover, the supply electrical power which is to be supplied to the target was 18 kW (electrical current of 30 A).

As the values of the currents which are supplied to the coils 13$u$, 13$d$, and 18, current values having negative polarity were applied thereto so that a downward perpendicular magnetic field is generated inside the vacuum chamber.

Additionally, regarding the current values to be supplied to the coils 13$u$, 13$d$, and 18, the current values of three conditions as shown in Table 1 were applied to the coils in order to evaluate the changes in coatability due to the fact that the current values are varied.

Next, each of the three conditions will be specifically described.

Under the condition 1, the current of −15 A was applied to each of the upper coil 13$u$ and the lower coil 13$d$ without applying an electrical current to the cathode coil 18.

Under the condition 2, the current of −15 A was applied to each of the cathode coil 18 and the lower coil 13$d$ without applying an electrical current to the upper coil 13$u$.

Under the condition 3, the current of −25 A was applied to the cathode coil 18 and the current of −15 A was applied to each of the upper coil 13$u$ and the lower coil 13$d$.

That is, under the condition 2, the relational expression I(2$d$)=I(3) was satisfied and the relational expression I(2$u$)=0 was satisfied where the value of the current supplied to the upper coil 13$u$ is defined as I(2$u$), the value of the current supplied to the lower coil 13$d$ is defined as I(2$d$), and the value of the current supplied to the cathode coil 18 is defined as I(3).

Furthermore, under the condition 3, the relational expression I(2$u$)=I(2$d$) was satisfied and the relational expression I(2$u$)<I(3) or the relational expression I(2$d$)<I(3) was satisfied.

Consequently, under each of the conditions 1 to 3, the length of time for sputtering was ten seconds, and the Cu film was formed.

TABLE 1

| | CURRENT VALUE (A) | | | BOTTOM COVERAGE (Tb/Ta) | | | SIDE COVERAGE (Tc/Td) | |
| | | | | CENTER OF | END OF | END OF | | |
| | I3 (CATHODE COIL) | I2u (UPPER COIL) | I2d (LOWER COIL) | BOTTOM SURFACE (Tb1/Ta) | BOTTOM SURFACE 1 (Tb2/Ta) | BOTTOM SURFACE 2 (Tb3/Ta) | UPPER PORTION (Td1/Tc1) | LOWER PORTION (Td2/Tc2) |
|---|---|---|---|---|---|---|---|---|
| CONDITION 1 | 0 | −15 | −15 | 75.6% | 73.0% | 61.8% | 64.3% | 79.5% |
| CONDITION 2 | −15 | 0 | −15 | 87.8% | 78.0% | 68.3% | 64.3% | 89.9% |
| CONDITION 3 | −15 | −15 | −15 | 88.1% | 87.3% | 78.5% | 100% | 100% |

As described above, the values of the currents that are supplied to the coils 13u, 13d, and 18 were varied, the Cu film was formed on the substrate W, and the formed Cu film was evaluated.

The evaluation standards (evaluation items) were configurations of the Cu film formed on the side wall and the bottom surface of the microscopic trench, that is, a bottom coverage and a side coverage.

FIG. 3 is a cross-sectional view schematically showing the microscopic trench in which the Cu film is formed with a high-aspect ratio.

Firstly, the bottom coverages were calculated based on the film thicknesses of the Cu films which were formed under each of the above-described conditions, that is, the film thickness of the Cu film formed on the bottom portion of the microscopic trench and the film thickness of the Cu film formed on the peripheral surface of the microscopic hole; and the bottom coverages formed under the conditions were compared with each other and thereby evaluated.

The thickness Ta of the film formed on the peripheral surface of the microscopic hole H and the thickness Tb of the film formed on the bottom surface of the microscopic hole as shown in FIG. 3 were measured, and the value in which the thickness of Tb is divided by the thickness of Ta, that is, a bottom coverage (Tb/Ta) was calculated.

Table 1 shows a result of the bottom coverage being calculated.

Table 1 shows a calculation result of the bottom coverages of the center portion of the substrate W (a region of a radius of 20 mm from the substrate center portion) and the peripheral portion of the substrate W (an outer region of the substrate (peripheral portion) separated by a distance of 130 mm from the substrate center).

The bottom coverage (Tb1/Ta) of the center portion of the bottom of the microscopic hole was measured on the center portion of the substrate W.

On the other hand, it is believed that the sputtered particles are incident to the peripheral portion of the substrate W at an inclined angle and adhered thereto. Therefore, the bottom coverages (Tb2/Ta and Tb3/Ta) of both ends of the bottom of the microscopic holes were measured.

When the condition 1 was compared with the condition 2, the result was obtained, in which the values of Tb1/Ta, Tb2/Ta, and Tb3/Ta (percentage) obtained under the condition 2 in which a Cu film is formed by use of the cathode coil 18 are greater than that of the condition 1.

The reason for this is that, the perpendicular magnetic field lines M passing through the target has a beneficial effect in the bottom coverage as shown in FIG. 2B.

Additionally, when the condition 2 was compared with the condition 3, the result was obtained, in which the values of Tb1/Ta, Tb2/Ta, and Tb3/Ta (percentage) obtained under the condition 3 are greater than Tb1/Ta, Tb2/Ta, and Tb3/Ta obtained under the condition 2.

Here, The condition 3 is a condition, in which the values of the currents which are to be applied to the upper coil 13u and the lower coil 13d are the same as each other, and a Cu film is formed by applying a current to the cathode coil 18 where the current value of the cathode coil 18 is greater than the values of the currents which are applied to the upper coil 13u and the lower coil 13d.

The reason for this is that, due to the value of the current applied to the cathode coil 18 which is located at the upstream side of the target 3 being greater than the values of the currents which are to be applied to the upper coil 13u and the lower coil 13d, a beneficial effect in the bottom coverage occurs.

Specifically, due to increasing a gradient of the magnetic field generated between the front position and the rear position of the target 3, that is, between the position close to the target 3 which is exposed to the sputtering face 3a and the position close to the target 3 facing the first magnetic field generation section 4, a beneficial effect in the bottom coverage occurs.

Subsequently, the side coverages were calculated based on the Cu film which was formed under the above-described conditions, the side coverages formed under the conditions were compared with each other and thereby evaluated.

The film thicknesses at two points (Tc1 and Td1) which are the film thicknesses of the Cu film formed on the upper portion face of the side face of the microscopic hole H shown in FIG. 3, and the film thicknesses at two points (Tc2 and Td2) which are the film thicknesses of the Cu film formed on the lower portion face of the side face of the microscopic hole H were measured, and the side coverage (Td/Tc) was calculated.

Table 1 shows a result of the side coverage being calculated.

When the condition 1 was compared with the condition 2, the result was obtained, in which the values of Td2/Tc2 (percentage) obtained under the condition 2 in which a Cu film is formed by use of the cathode coil 18 are greater than that of the condition 1.

Particularly, it was found that the side coverage formed at the lower portion of the side face is improved in the Cu film formed on the side face of the microscopic hole H under the condition 2.

Regarding the film thickness of the Cu film formed on the side face of the microscopic hole H under the condition 3, it was found that the film thickness thereof at the lower portion of the side face hardly changed compared with the film thickness thereof at the upper portion of the side face, and that the same coatability at the peripheral portion of the substrate as the coatability of the center portion of the substrate is realized.

According to the above-described results, it was found that the coverage is improved by applying the current to the cathode coil.

Particularly, in the films formed under the conditions in which the cathode coil, the upper coil, and the lower coil are 25 A, 15 A, and 15 A in current values, respectively, the evaluation result of both the bottom coverage and the side coverage was all excellent.

Because of this, the problem of asymmetric coverage being formed was solved in that the shape of the coat formed between the bottom of the microscopic holes and one of the side walls thereof is different from the shape of the coat formed between the bottom of the microscopic holes and the other of the side walls thereof in the cross-sectional face of the microscopic holes formed at the peripheral portion of the substrate.

INDUSTRIAL APPLICABILITY

The invention is widely applicable to a film formation apparatus used for forming a coat on a surface of a body to be processed, particularly, applicable to a film formation apparatus employing a DC magnetron method using a sputtering method which is one of several thin film forming methods.

What is claimed is:

1. A film formation sputtering apparatus comprising:
a chamber having an inner space in which both a body to be processed and a substantially planar target are disposed so that the body to be processed and the target are opposed to each other, the body to be processed having a film formation face, the target having a sputtering face;
a pumping section reducing pressure inside the chamber;
a first magnetic field generation section generating a magnetic field in the inner space to which the sputtering face is exposed, the first magnetic field generation section comprising a yoke disposed in parallel with the target, and a first magnet and a second magnet which are provided at a face of the yoke close to the target so that polarities of leading ends of the first magnet and the second magnet arranged at a position close to the target are alternately different from each other;
a direct-current power source applying a negative direct electric current voltage to the target;
a gas introduction section introducing a sputter gas into the chamber;
a second magnetic field generation section generating a perpendicular magnetic field perpendicular to the sputtering face and the film formation face, the second magnetic field generation section allowing perpendicular magnetic lines of force of the perpendicular magnetic field to pass between an entire surface of the sputtering face and an entire surface of the film formation face of the body to be processed, the second magnetic field generation comprising a first generation portion and a second generation portion, both the first generation portion and the second generation portion being provided at external walls of the chamber and provide between the target and the body to be processed, the second magnetic field generation comprising a first power supply device configured to supply a current so that a current defined as "I(2u)" is applied to the first generation portion and so that a current defined as "I(2d)" is applied to the second generation portion; and
a third magnetic field generation section disposed above a holder supporting the target, the third magnetic field generation section having an outer shape larger than an outer shape of the target, the third magnetic field generation section comprising a second power supply device configured to supply a current so that a current defined as "I(3)" is applied to the third magnetic field generation section, relational expression I(2u) =I(2d) is satisfied, and relational expression I(2u)<I(3) or relational expression I(2d)<I(3) is satisfied.

2. A film formation sputtering apparatus comprising:
a chamber having an inner space in which both a body to be processed and a substantially planar target are disposed so that the body to be processed and the target are opposed to each other, the body to be processed having a film formation face, the target having a sputtering face;
a pumping section reducing pressure inside the chamber;
a first magnetic field generation section generating a magnetic field in the inner space to which the sputtering face is exposed, the first magnetic field generation section comprising a yoke disposed in parallel with the target, and a first magnet and a second magnet which are provided at a face of the yoke close to the target so that polarities of leading ends of the first magnet and the second magnet arranged at a position close to the target are alternately different from each other;
a direct-current power source applying a negative direct electric current voltage to the target;
a gas introduction section introducing a sputter gas into the chamber;
a second magnetic field generation section generating a perpendicular magnetic field perpendicular to the sputtering face and the film formation face, the second magnetic field generation section allowing perpendicular magnetic lines of force of the perpendicular magnetic field to pass between an entire surface of the sputtering face and an entire surface of the film formation face of the body to be processed, the second magnetic field generation comprising a first generation portion and a second generation portion, both the first generation portion and the second generation portion being provided at external walls of the chamber and provided between the target and the body to be processed, the second magnetic field generation comprising a first power supply device configured to supply a current so that a current defined as "I(2u)" is applied to the first generation portion and so that a current defined as "I(2d)" is applied to the second generation portion; and
a third magnetic field generation section disposed above a holder supporting the target, the third magnetic field generation section having an outer shape larger than an outer shape of the target, the third magnetic field generation section comprising a second power supply device configured to supply a current so that a current defined as "I(3)" is applied to the third magnetic field generation section, relational expression I(2d) =I(3) is satisfied, and relational expression I(2u) = 0 is satisfied.

* * * * *